United States Patent
Giraud et al.

(10) Patent No.: US 9,911,737 B2
(45) Date of Patent: Mar. 6, 2018

(54) INTEGRATED CIRCUIT COMPRISING TRANSISTORS WITH DIFFERENT THRESHOLD VOLTAGES

(71) Applicants: STMicroelectronics SA, Mountrouge (FR); Commissariat àl'énergie atomique et aux énergies alternatives, Paris (FR)

(72) Inventors: Bastien Giraud, Grenoble (FR); Philippe Flatresse, Lapierre (FR); Jean-Philippe Noel, Montbonnot Saint Martin (FR); Bertrand Pelloux-Prayer, Crolles (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/435,004

(22) PCT Filed: Oct. 11, 2013

(86) PCT No.: PCT/EP2013/071340
§ 371 (c)(1),
(2) Date: Apr. 10, 2015

(87) PCT Pub. No.: WO2014/057112
PCT Pub. Date: Apr. 17, 2014

(65) Prior Publication Data
US 2015/0287722 A1   Oct. 8, 2015

(30) Foreign Application Priority Data
Oct. 12, 2012  (FR) .................................... 12 59762

(51) Int. Cl.
*H01L 27/092* (2006.01)
*H01L 27/12* (2006.01)
*H01L 21/8238* (2006.01)

(52) U.S. Cl.
CPC ........ *H01L 27/092* (2013.01); *H01L 27/1203* (2013.01); *H01L 21/823892* (2013.01)

(58) Field of Classification Search
CPC ....... H01L 27/11807; H01L 2924/1306; H01L 27/0928
See application file for complete search history.

(56) References Cited

U.S. PATENT DOCUMENTS 9,190,334 B2 * 11/2015 Thomas .................. H01L 21/84
2003/0001658 A1 * 1/2003 Matsumoto ......... H01L 27/1203
327/534

(Continued)

FOREIGN PATENT DOCUMENTS

WO   WO 2012160071 A1 * 11/2012  .......... H01L 27/1108

OTHER PUBLICATIONS

Noel et al., English Translated of WO/2012/160071 Published Nov. 29, 2012; (Machine translated Nov. 18, 2015).*

*Primary Examiner* — Mohsen Ahmadi
(74) *Attorney, Agent, or Firm* — Occhiuti & Rohlicek LLP

(57) ABSTRACT

An integrated circuit includes a substrate with first and second cells having first and second FDSOI field-effect transistors. There are first and second ground planes, a buried oxide layer and first and second wells, under the ground planes. The first well and the first ground plane have the same doping and the second well and the second ground plane have the same doping. The first and second cells are adjoined and their transistors are aligned in a first direction. The wells of the first cell and the first well of the second cell are doped opposite of the second well. A control device applies a first electrical bias to the wells with the first doping and a second electrical bias to the well with the second (Continued)

doping. The transistors of the first cell and second cell have different threshold voltage levels.

10 Claims, 2 Drawing Sheets

(56) References Cited

U.S. PATENT DOCUMENTS

| | | | | |
|---|---|---|---|---|
| 2012/0126333 A1* | 5/2012 | Thomas | .................. | H01L 21/84 |
| | | | | 257/369 |
| 2013/0065366 A1* | 3/2013 | Thomas | .................. | H01L 21/84 |
| | | | | 438/154 |
| 2013/0089978 A1* | 4/2013 | Noel | .................... | H01L 21/768 |
| | | | | 438/622 |
| 2014/0015052 A1* | 1/2014 | Fenouillet-Beranger | | H01L 27/1203 |
| | | | | 257/348 |
| 2014/0017821 A1* | 1/2014 | Fenouillet-Beranger | | H01L 25/07 |
| | | | | 438/10 |
| 2014/0017856 A1* | 1/2014 | Fenouillet-Beranger | | H01L 29/66477 |
| | | | | 438/151 |
| 2014/0017858 A1* | 1/2014 | Fenouillet-Beranger | | H01L 27/1203 |
| | | | | 438/152 |
| 2014/0017871 A1* | 1/2014 | Fenouillet-Beranger | | H01L 29/66234 |
| | | | | 438/311 |
| 2014/0091846 A1* | 4/2014 | Agut | .................. | H03K 3/02337 |
| | | | | 327/206 |

* cited by examiner

Fig. 1
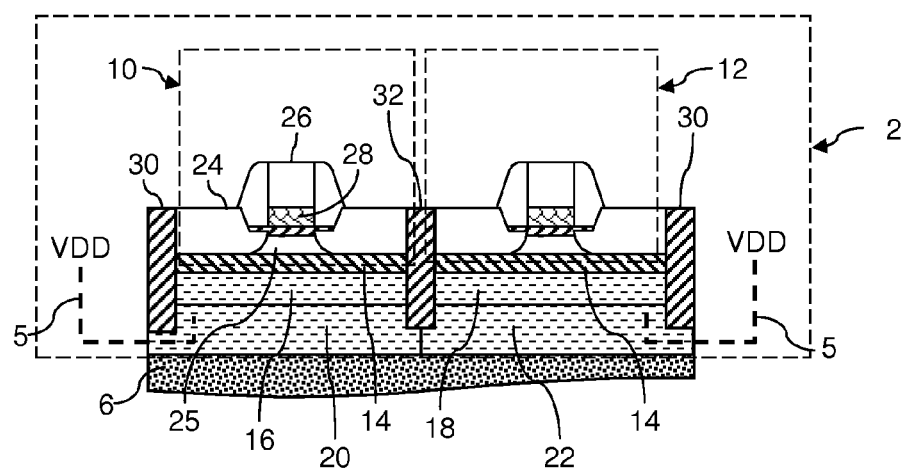
Fig. 2
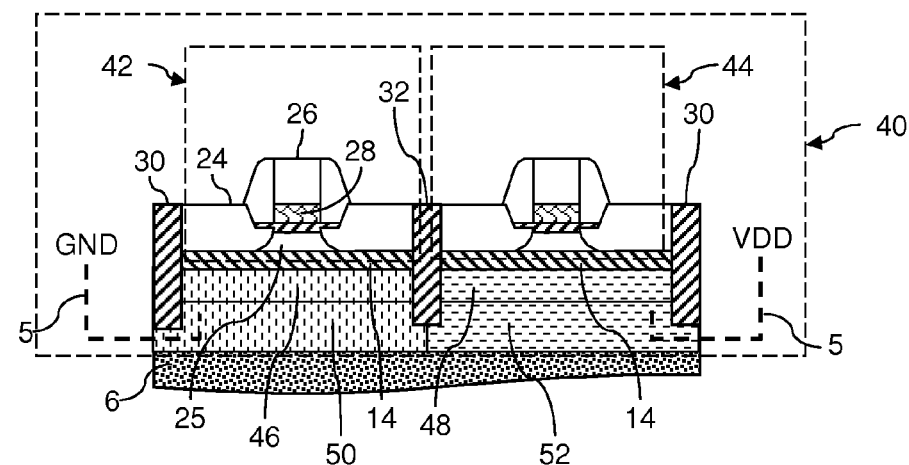
Fig. 3
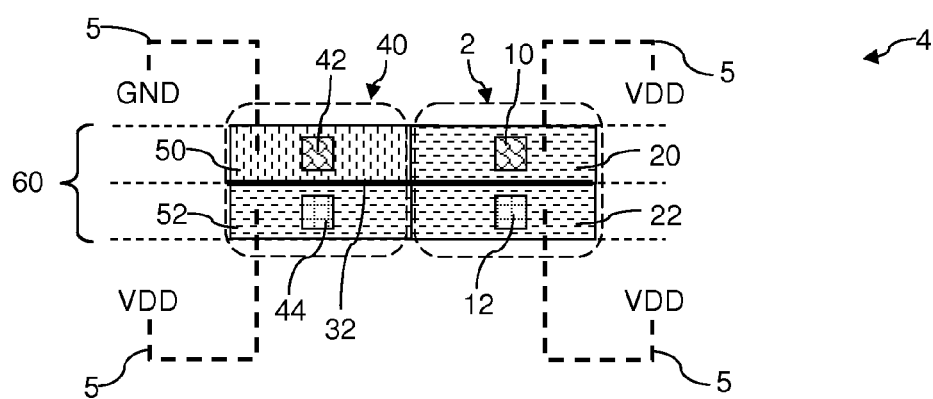

INTEGRATED CIRCUIT COMPRISING TRANSISTORS WITH DIFFERENT THRESHOLD VOLTAGES

RELATED APPLICATIONS

This application is a U.S. National Stage of international application number PCT/EP2013/071340 filed Oct. 11, 2013, which claims the benefit of the priority date of French Patent Application FR 1259762, filed Oct. 12, 2012, the contents of which are herein incorporated by reference.

FIELD OF INVENTION

The invention relates to an integrated circuit, and in particular an integrated circuit produced on a substrate of silicon-on-insulator (SOI) type. The invention also relates to a method using this integrated circuit.

BACKGROUND

SOI technology consists in separating a fine silicon layer (a few nanometers) on a silicon substrate by a relatively thick layer of insulator (a few tens of nanometers as a general rule).

Integrated circuits produced in SOI technology exhibit a certain number of advantages. Such circuits generally exhibit lower electrical consumption for equivalent performance. Such circuits also bring about lower junction capacitances, which make it possible to improve switching speed. Moreover, the phenomenon of spurious triggering (referred to as "latchup") encountered by "bulk" technology metal-oxide-semi-conductor (MOS) transistors can be avoided. Such circuits therefore turn out to be particularly suitable for applications of SoC ("Systems on Chip") or MEMS ("Micro Electro-Mechanical Systems") type. It is also noted that SOI integrated circuits are less sensitive to the effects of ionizing radiations and thus turn out to be more reliable in applications where such radiations can bring about operating problems, notably in space applications. SOI integrated circuits can notably comprise random-access memories of SRAM ("Static Random Access Memory") type and logic gates.

The reducing of the static consumption of logic gates while increasing their toggling speed forms the subject of much research. Certain integrated circuits under development integrate both low-consumption logic gates and also logic gates with high toggling speed. To generate these two types of logic gates on one and the same integrated circuit, the threshold voltage (abbreviated $V_T$) of certain transistors is lowered to form logic gates with high toggling speed, and the threshold voltage of other transistors is increased to form low-consumption logic gates. In "bulk" technology, the modulation of the threshold voltage level of transistors of the same type is performed by making the doping level of their channel different. However, in fully depleted channel semi-conductor on insulator technology, better known by the acronym FDSOI (for "Fully Depleted Silicon On Insulator"), the doping of the channel is almost zero ($10^{15}$ cm$^{-3}$). Thus, the doping level of the channel of the transistors cannot therefore exhibit any significant variations, thereby preventing the threshold voltages from being made different in this fashion. A solution proposed in certain studies, to produce transistors of the same type with distinct threshold voltages, is to integrate various gate materials for these transistors. However, the practical production of such an integrated circuit turns out to be technically tricky and economically prohibitive.

In order to have distinct threshold voltages for various transistors in FDSOI technology, it is also known to use an electrically biased ground plane (or "back plane") disposed between a thin insulating oxide layer and the silicon substrate. By altering the doping of the ground planes and their electrical bias, it is possible to improve the electrostatic control of these transistors, thereby making it possible to define various ranges of threshold voltages for these transistors. It is thus possible to provide so-called LVT (for "Low VT") low threshold voltage transistors, so-called HVT (for "High VT") high threshold voltage transistors, and so-called SVT (for "Standard VT"), or RVT (for "Regular VT") intermediate threshold voltage transistors. Typically, LVT transistors exhibit a threshold voltage of less than or equal to 350 mV, HVT transistors greater than or equal to 500 mV and RVT transistors between 350 mV and 500 mV.

Such transistors are described, for example, in the technical application note of P. Flatresse et al., "Planar fully depleted silicon technology to design competitive SOC at 28 nm and beyond", STMicroelectronics, 2012, available on the Internet site "www.soiconsortium.org".

In a known manner, such transistors exhibiting different threshold voltages can be integrated within one and the same integrated circuit. Such co-integration makes it possible notably to benefit from several threshold voltage spans, together with better operating flexibility of the circuit. However, this co-integration can lead to a degradation in electrical performance of the circuit, or else bring about violations of drafting rules during circuit design steps.

Typically, the transistors are placed in the circuit within so-called standard cells. These standard cells generally each comprise solely transistors of a given threshold voltage level. These cells are typically placed alongside one another, so as to form rows of cells, parallel to one another.

Generally, in the presence of cells having distinct threshold voltages, it is preferable to co-integrate the cells exhibiting different threshold voltages within same rows. Indeed, placing cells with distinct threshold voltage along rows of cells with homogeneous threshold voltage can lead to difficulties with the circuit design (increase in length of electrical interconnections between cells, overconsumption of occupied surface area) which, ultimately, attenuate the advantages afforded by co-integration.

However, placing cells with distinct threshold voltages in one and the same row can lead to other difficulties. Notably, the steep discontinuity between semi-conducting wells of the various cells can lead to the formation of singular points. These singular points are situated at the junction between four wells exhibiting pairwise opposite dopings. These singular points can lead, according to the electrical biases applied to the wells, to the appearance of leakage currents caused by the forward bias of p-n junctions formed by these wells.

SUMMARY OF INVENTION

There therefore exists a need for an integrated circuit comprising MOS transistors of FDSOI technology exhibiting different threshold voltages, these transistors being integrated into the circuit without degrading the consumption performance of the circuit, while maintaining an optimal spatial distribution of the transistors in this circuit.

The invention thus pertains to an integrated circuit in accordance with claim 1.

According to another embodiment, this circuit comprises one or more characteristics of the dependent claims of this circuit.

Other characteristics and advantages of the invention will emerge clearly from the description thereof given hereinafter, by way of wholly nonlimiting indication, with reference to the appended drawings.

BRIEF DESCRIPTION OF THE DRAWINGS

FIG. 1 illustrates a transverse sectional view of a cell of an integrated circuit for a first embodiment of the invention;

FIG. 2 illustrates a transverse sectional view of another cell of an integrated circuit for the first embodiment of the invention;

FIG. 3 schematically illustrates a longitudinal sectional view of a row of an integrated circuit containing the cells of FIGS. 1 and 2;

DETAILED DESCRIPTION

Figure 4:
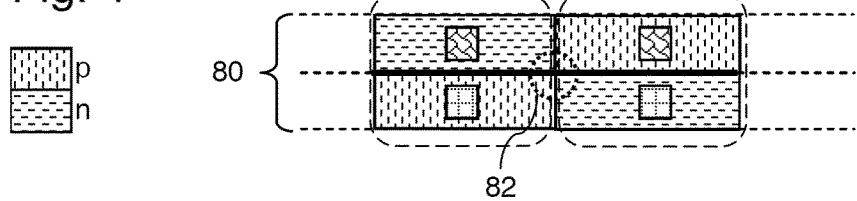
FIG. 4 schematically illustrates a longitudinal sectional view of a row of an integrated circuit according to the prior art.

Generally, the invention is aimed at facilitating the co-integration, in an integrated circuit, of first and second standard cells comprising transistors exhibiting distinct threshold voltages. The cells each exhibit at least one nMOS transistor and one pMOS transistor, the nMOS transistors being aligned, the pMOS transistors being likewise aligned. The transistors of the first cell exhibit one and the same threshold voltage level. The transistors of the second cell exhibit one and the same threshold voltage level, different from the level of the first cell.

By choosing dopings of the same type for all the wells of a first cell, and dopings of opposite types in the wells of a second cell, the first and second cells can be placed contiguously with respect to one another within one and the same row of the circuit, making it possible to limit the formation of singular points and therefore the appearance of leakage currents between these two cells, while making it possible to preserve intrinsically one and the same voltage level for the nMOSs and the pMOSs of the first cell. A control device, also dubbed a bias circuit, makes it possible to apply identical electrical biases to the wells exhibiting the same type of doping.

FIG. 1 represents a first cell 2 of LVT type of an integrated circuit 4 represented in FIG. 3. This circuit 4 comprises a semi-conducting substrate 6. Here this substrate 6 exhibits a doping of p type, with a dopant concentration of less than or equal to $10^{16}$ cm$^{-3}$ or to $3*10^{15}$ cm$^{-3}$. The circuit 4 furthermore comprises a bias circuit 5, for applying electrical biases. For simplicity, only a portion of this circuit 5 is represented, schematically, in FIG. 1.

The cell 2 comprises:
  a buried layer 14 of an electrically insulating material;
  field-effect MOS transistors 10 and 12 of opposite types, whose source, drain and channel are formed in a semi-conducting layer 24 on the buried layer 14. The transistor 10 is here of p type (pMOS), the transistor 12 is here of n type (nMOS);
  semi-conducting ground planes 16 and 18, situated under the layer 14 and placed plumb, respectively, with the transistors 10 and 12;
  semi-conducting wells 20 and 22, situated, respectively, under the ground planes 16 and 18 and extending parallel to the substrate 6.

The transistors 10 and 12 are produced according to FDSOI technology. The transistor 10 thus comprises a semi-conducting layer 24, the so-called active layer, surmounted by a gate stack 26. This layer 24 forms a channel 25 between a source and a drain of the transistor 10. For simplicity, this layer 24 is not described in detail in FIG. 1. In a manner known in FDSOI technology, this layer 24 is in a depleted state and exhibits a very low doping level, typically less than or equal to $10^{15}$ cm$^{-3}$.

In this description, the thickness and the depth are defined with respect to a direction perpendicular to a plane in which the substrate 6 extends.

The channel 25 exhibits, for the 28 nm technology node, a channel length of 24 nm.

The stack 26 comprises notably a gate 28. This gate 28 is here produced by deposition of a layer of titanium nitride (TiN) 20 nm in thickness. This gate 28 exhibits for example an intermediate work function (referred to as "midgap"), for example equal to 4.65 eV.

The layer 14 electrically isolates, notably, the layer 24 from the ground plane 16. This layer 14 extends substantially parallel to the substrate 6. The layer 14 is here of ultrafine type, termed UTBOX (for "Ultra-Thin Buried Oxide Layer"). This layer 14 advantageously exhibits a thickness of less than 50 nm and, preferably, of less than or equal to 25 nm. By electrically insulating material, is meant here a material whose electrical resistivity, measured at a temperature of 20° C., is greater than or equal to $10^5$ Ω·m or to $10^6$ Ω·m. For example, this layer 14 is made of silicon oxide (SiO$_2$). The combination of such a layer 14 with a bias applied to the ground planes 16 and 18 makes it possible to influence the threshold voltage of the transistors 10 and 12.

The ground plane 16 makes it possible to control electrostatic properties of the transistor 10, by applying an electrical potential to this ground plane 16. For this purpose, the ground plane 16 extends parallel to the substrate 6, under the layer 14, and is disposed plumb with the transistor 10. This ground plane 16 is furthermore situated directly and solely on the well 20, so that the electrical bias of this ground plane 16 can be applied by way of the well 20.

In this example, the well 20 exhibits a doping of n type, with a dopant concentration of between $10^{16}$ and $10^{18}$ cm$^{-3}$. The ground plane 16 exhibits a doping of the same type as the doping of the well 16. The dopant concentration of the ground plane 16 is here between $10^{18}$ and $10^{20}$ cm$^{-3}$. This ground plane 16 exhibits here a thickness of between 50 nm and 300 nm and, preferably, between 70 nm and 200 nm. Here the ground plane 16 and the well 20 are fabricated from one and the same semi-conducting material, for example silicon, by applying distinct steps of ion implantation. Here each of the ground plane 16 and of the well 20 exhibits a distinct doping profile.

The cell 2 furthermore comprises isolation trenches 30 and 32 ("shallow trench isolation"), to electrically isolate the transistors 10, 12 from one another. Isolation of the transistors 10 and 12, is understood to mean here that the ground planes 16 and 18 are notably electrically isolated from one another. More specifically, the trench 30 makes it possible to electrically isolate the transistors 10, 12 from the exterior of the cell 2. For this purpose, the trench 30 surrounds the cell 2 over the whole of its exterior outline. The trench 32 makes it possible to electrically inter-isolate the transistors 10 and 12 of the cell 2. In this example, the trench 32 is situated between the transistors 10 and 12. These trenches 30 and 32 extend, perpendicularly to the substrate 6, from an upper face of the layer 14 to a lower end, situated below the interface separating the ground plane 16 from the well 20. These trenches 30 and 32 are made of an electrically insulating material. For example, these trenches 30 and 32 are made of silicon oxide.

The transistor 12 is similar to the transistor 10:
the ground plane 18 and the well 22 both exhibit dopings of n type;
the concentrations of dopants are similar to those of the transistor 10;
the transistor 12 comprises a semi-conducting layer surmounted by a gate stack, this layer forming a channel between a source and a drain of the transistor 12.

The transistor 12 is however of n type (nMOS). With the exception of this difference, everything that has been described with reference to the transistor 10 applies to the transistor 12.

Here the bias circuit 5 is configured to electrically bias the wells 20 and 22 to a supply voltage VDD of the circuit 4. This circuit 5 comprises, for example, an electrical voltage generator configured to provide specific electrical voltages on the basis of an electrical ground GND and of the supply voltage VDD of the circuit 4. The bias circuit 5 can also be configured to provide specific electrical voltages different from Vdd and Gnd, for example Vdds and Gnds. Thus, in this example, the transistors 10 and 12 both exhibit threshold voltages of RVT (for "Regular $V_T$") type. For example, these threshold voltages lie between 350 mV and 500 mV. The threshold voltage values of the transistors 10 and 12 are obtained, notably, by virtue of the choice of the dopings of the ground planes 16 and 18 and wells 20 and 22, by virtue of the choice of the bias voltage for these ground planes, and on account of the use of a layer 14 of UTBOX type. Thus, the cell 2 can be used for its properties of low energy consumption.

The levels of the threshold voltages of the transistors 10 and 12 are identical, but on account of the choices of type of doping of the ground planes 16 and 18 and of their bias voltage, the amplitude of the threshold voltage of the transistor 10 will be slightly greater than the amplitude of the threshold voltage of the transistor 12. The transistor 10 does indeed correspond to a known transistor structure of RVT type with bias of full FBB (for "Full Forward Back Biasing") type. It will be possible for example to consider that two threshold voltages are of the same level if their amplitude differs only by less than 30 mV.

FIG. 2 represents a second cell 40 of RVT type for a consumption/speed compromise of the circuit 4. This cell 40 is identical to the cell 2, except that:
the transistors 10 and 12 are replaced, respectively, with transistors 42 and 44,
the ground planes 16 and 18 are replaced, respectively, with ground planes 46 and 48,
the wells 20 and 22 are replaced, respectively, with wells 50 and 52.

The ground plane 46 and the well 50 exhibit a doping of one and the same type, this doping being of an opposite type to the doping of the ground plane 16 and of the well 20. In this example, the ground plane 46 and the well 50 both exhibit a doping of p type.

Likewise, the ground plane 48 and the well 52 exhibit a doping of one and the same type, this doping being of the same type as the doping of the ground plane 18 and of the well 22. In this example, the ground plane 48 and the well 52 both exhibit a doping of n type.

Furthermore, the bias circuit 5 is here configured to electrically bias the well 50 to the ground GND and the well 52 to the voltage VDD. On account of the bias of the well 50 and of its doping of p type, the threshold voltage of the transistor 42 is of LVT type. For example, these threshold voltages are less than or equal to 350 mV. On account of the bias of the well 52 to VDD, in combination with a doping of n type, the transistor 44 has a bias of Full FBB type and would thus normally exhibit a configuration of RVT type. However, in order to have a transistor 44 exhibiting despite everything a threshold voltage level of LVT type, a technological parameter for compensating the threshold voltage is used on this transistor 44. The presence of this technological parameter allows compensation of the threshold voltage which here has a cell balancing effect.

The compensating technological parameter can for example be the length of the channel of the transistor 44 (referred to as "poly bias"). In order to increase the value of the threshold voltage, the channel of the transistor 44 exhibits a reduced length. For this purpose, the channel 25 presents here a reduced channel length of 4 nm or of 6 nm or of 10 nm with respect to a standard channel length for a pMOS transistor, for example the length of the channel of the transistor 10. In this example, the transistor 44 thus exhibits a channel length of strictly less than 24 nm.

This reduction in the channel length modifies the threshold voltage of the transistor 44, by virtue of the so-called short channel effect. This modification thus compensates the modification of value of the threshold voltage brought about by setting the well 52 to VDD. The threshold voltage value of the transistor 44 is thus of the same level as the threshold voltage of the transistor 42, although its amplitude may be slightly lower.

The technological compensating parameter can also be the choice of the gate material, and in particular the value of its work function.

FIG. 3 represents a row 60 of the circuit 4. This row 60 here exhibits a rectilinear shape and extends parallel to the substrate 6. This row 60 comprises a plurality of cells and, in particular, cells 2 and 40. A cell 2 and a cell 40 are here placed one alongside the other, in a contiguous manner, within the row 60, in such a way that the trench 32 extends parallel to the row 60. The transistors 10 and 42, of pMOS type, are mutually aligned in a direction parallel to the row 60. The transistors 12 and 44, of nMOS type, are mutually aligned in another direction, likewise parallel to the row 60. For simplicity, only the respective wells and transistors of these cells 2 and 40 are represented in FIG. 3.

The co-integration of these cells 2 and 40 within one and the same row 60 makes it possible to benefit, in the row 60, from several transistors exhibiting threshold voltages of distinct levels. The configuration of the row 60 makes it possible to avoid a problem with the design of the row 80 illustrated in FIG. 4. Indeed, such a configuration makes it possible to avoid the formation of singular points, at the intersection between four wells.

A singular point 82 such as this appears on an interface line between an n-doped well and a p-doped well for the nMOSs and between a p-doped well and an n-doped well for the pMOSs, the dopings forming a chessboard pattern as is schematically illustrated in FIG. 4 for a row 80 according to the prior art. Such a disposition can thus be drafted during circuit design steps, but does not satisfy the standard design rules typically used (so-called "Design Rule Manual"). Such a disposition can indeed give rise to undesirable results during the fabrication of the circuit 4. Notably, such a disposition can favor the appearance of leakage currents possibly resulting from the formation of a forward biased p-n junction between these wells of dopings of the same type but of different biases. The bias applied by the bias circuit 5 to the wells 20, 22 and 52 of the transistors of the row, thereby making it possible to avoid leakage currents between these wells. This bias is denoted V1. An electrical bias V2 is furthermore applied by the circuit 5 to the well 50 of the row. Here the bias V2 exhibits a different value from V1. Here, V1 is equal to VDD. The bias V2 is chosen equal to GND here.

Thus, in the configuration of the row 60, it is possible to have cells containing transistors with distinct threshold voltages coexist within this row, while eliminating the possibility of singular points occurring within this row. Notably, the choice of the dopings and of the electrical biases of the respective wells of these cells 2 and 40 makes it possible for them to be made to adjoin one another within the row 60, while limiting the risk of appearance of leakage currents between these wells. Moreover, by co-integrating such cells within one and the same row, rather than placing these cells in distinct rows, it is possible to reduce the length of the electrical interconnections inter-linking these cells. Indeed, by adjoining the cells 2 and 40 of the row 60, the wells 20, 22 and 52, which exhibit the same doping type, can all be biased electrically by the same bias V1. Thus, when cells 2 and 40 are adjoined in alternation with one another right along the row 60, electrical continuity exists between all the wells 20, 22 and 52 of this row 60, since they exhibit this same type of doping. These wells can then all be electrically biased to the value V1 without it being necessary therefor to insert intermediate electrical contacts specific to each cell in order to bias each of these wells. On the contrary, here, only a reduced number of electrical contacts is necessary in order to apply the bias V1 in the row 60. This simplifies the scheme of interconnections of the circuit 4 and therefore increases the compactness of the circuit 4. For example, electrical contacts ensuring electrical connection between the portion of semi-conducting material forming these wells 20, 22 and 52 on the one hand, and the circuit 5 on the other hand, are disposed solely at the ends of the row 60. Thus, the electrical performance of the circuit 4 can be improved. Finally, this disposition of the cells 2 and 40 makes it possible to avoid recourse to a deeply buried semi-conducting well to electrically isolate from one another wells of opposite dopings, in particular if values of the bias voltages V1 and V2 are chosen such that the p-n junctions between the wells are not made to conduct. This makes it possible to simplify the design and the fabrication of the circuit 4.

Numerous other embodiments are possible.

Each of the cells 2 and 40 can contain more than one transistor of each type, pMOS or nMOS. For example, the cell 2 comprises several additional transistors identical to the transistor 10. These additional transistors are all placed above the ground plane 16, in such a way that their respective threshold voltages can be modified by applying an electrical bias to the well 20. The same goes for the transistor 12.

The circuit 5 can make direct use of the electrical voltages VDD and GND present in the circuit 4.

The bias value V2 can be different from V1.

Likewise, the value of V1 can be different from VDD or from GND.

Advantageously, the electrical bias of the well 50 is ensured by way of the substrate 6, which exhibits a doping of one and the same type. For this purpose, the circuit 5 is for example connected electrically to the substrate 6 so as to apply the bias V2 to this substrate 6 in such a way that this bias is applied to the well 50. This makes it possible to reduce the number of electrical contacts.

As a variant, if the substrate 6 exhibits a doping of different type from that of the well 50, then the electrical bias of this well 50 can be achieved by way of a deeply buried well, disposed under and plumb with the well 50.

The technological parameter for compensating the threshold voltage level of the transistor 44 can be achieved in a different manner. As a variant, this compensation is achieved by replacing the gate 28 of the transistor 44 with a gate comprising a material whose work function is different from the work function of the gate 28. For example, the gate 28 comprises a metal exhibiting a work function of P type, equal to 4.85 eV, or else a work function of N type, exhibiting a work function of 4.45 eV. In another variant, in the case where the transistors exhibit a very small gate width, for example less than 20 nm, the compensating technological parameter can be achieved by modifying this width of the gate 28 by a few nanometers. In another variant, the compensating parameter can be applied by adapting the electrical bias applied in common to the wells 20, 22 and 52, for example, by applying a bias VDD−ΔV with ΔV equal to 0.5 V to these wells 20, 22 and 52, instead of applying the bias VDD. The voltages GND and VDD can for example be modulated by a value +ΔV upwards or downwards.

The invention claimed is:

1. An integrated circuit, comprising:
   a semi-conductor substrate;
   first and second cells, each comprising:
   first and second field-effect transistors of FDSOI type, and, respectively, one being of pMOS type and the other being of nMOS type;
   first and second semi-conducting ground planes, respectively placed under the first and second transistors;
   a buried oxide layer extending between the first and second transistors on the one hand, and the first and second ground planes on the other hand;
   first and second semi-conducting wells, placed respectively under the first and second ground planes and separating these ground planes from the semi-conducting substrate, the first well and the first ground plane exhibiting the same type of doping, the second well and the second ground plane exhibiting the same type of doping;
   the first and second cells being adjoined to one another so that their first transistors are aligned in a first direction parallel to the substrate and their second transistors are aligned in the first direction;
   the first and second wells of the first cell and the first well of the second cell exhibiting one and the same doping of a first type, and the second well of the second cell exhibiting a doping of a second type, opposite to the first type;
   the integrated circuit furthermore comprising a control device for applying one and the same first electrical bias to the wells exhibiting the first type of doping and a second electrical bias distinct from the first bias to the well exhibiting the second type of doping;
   the transistors of the first cell being configured to exhibit a first threshold voltage level, the transistors of the second cell being configured to exhibit a second threshold voltage level different from the first level.

2. The circuit as claimed in claim 1, in which the first transistor of the second cell exhibits a compensating technological parameter so that the threshold voltage of said transistor exhibits the same threshold voltage level as the second transistor of this second cell.

3. The circuit as claimed in claim 2, in which said technological parameter for compensating the threshold voltage of the first transistor of the second cell is chosen from among a group composed of the following characteristics:

the length of its channel is less than the channel length of the second transistor of the second cell;

its gate is formed of a material exhibiting a different work function from the material forming the gate of the second transistor of the second cell.

4. The circuit as claimed in claim 3, in which the length of the channel of the second transistor of the second cell is greater by 2 nm than the channel length of the first transistor of the second cell, in such a way that the first and the second transistors of the second cell exhibit one and the same threshold voltage level.

5. The circuit as claimed in claim 3, in which the length of the channel of the second transistor of the second cell is greater by 6 nm than the channel length of the first transistor of the second cell, in such a way that the first and the second transistors of the second cell exhibit one and the same threshold voltage level.

6. The circuit as claimed in claim 1, in which the control device is configured so that said same first electrical bias applied to the wells exhibiting the first type of doping is distinct from the electrical supply voltage (VDD) of the circuit and from the electrical ground (GND) of the circuit, so that the threshold voltage of the first transistor of the second cell exhibits one and the same threshold voltage level as the second transistor of this second cell.

7. The circuit as claimed in claim 1, in which the first and second types of dopings correspond, respectively, to dopings of n and p type.

8. The circuit as claimed in claim 7, in which the control device is configured to apply an electrical bias to the second well of the second cell different from the bias applied to the first well of the first cell.

9. The circuit as claimed in claim 8, in which the levels of the threshold voltages of the transistors of the second cell are less than the levels of the threshold voltages of the transistors of the first cell.

10. The circuit as claimed in claim 1, in which each of the first and second cells comprises a deep isolation trench extending in a direction perpendicular to the substrate, down to below the ground planes of these cells, the isolation trench separating the first transistors from the second transistors of said cells.

* * * * *